United States Patent
Percey et al.

(10) Patent No.: US 7,046,052 B1
(45) Date of Patent: May 16, 2006

(54) PHASE MATCHED CLOCK DIVIDER

(75) Inventors: Andrew K. Percey, Sunnyvale, CA (US); Raymond C. Pang, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/837,210

(22) Filed: Apr. 30, 2004

(51) Int. Cl.
*H03K 21/00* (2006.01)
*H03K 23/00* (2006.01)
*H03K 25/00* (2006.01)

(52) U.S. Cl. .................... 327/115; 327/117; 377/47; 377/48

(58) Field of Classification Search .............. 327/115, 327/117; 377/47, 48
See application file for complete search history.

(56) References Cited

U.S. PATENT DOCUMENTS

| | | | |
|---|---|---|---|
| 5,068,628 A | 11/1991 | Ghoshal | 331/1 A |
| 5,465,076 A | 11/1995 | Yamauchi et al. | 331/179 |
| 5,489,864 A | 2/1996 | Ashuri | 327/161 |
| 5,646,564 A | 7/1997 | Erickson et al. | 327/158 |
| 5,712,884 A | 1/1998 | Jeong | 375/375 |
| 5,789,953 A * | 8/1998 | Au et al. | 327/116 |
| 5,796,673 A | 8/1998 | Foss et al. | 365/233 |
| 5,963,074 A | 10/1999 | Arkin | 327/276 |
| 6,043,717 A | 3/2000 | Kurd | 331/17 |
| 6,104,223 A | 8/2000 | Chapman et al. | 327/276 |
| 6,125,157 A | 9/2000 | Donnelly et al. | 375/371 |
| 6,151,356 A | 11/2000 | Spagnoletti et al. | 375/226 |
| 6,184,753 B1 | 2/2001 | Ishimi et al. | 331/34 |
| 6,194,930 B1 | 2/2001 | Matsuzaki et al. | 327/156 |
| 6,289,068 B1 | 9/2001 | Hassoun et al. | 326/41 |
| 6,292,040 B1 | 9/2001 | Iwamoto et al. | 327/158 |
| 6,400,180 B1 | 6/2002 | Wittig et al. | 375/376 |
| 6,400,735 B1 | 6/2002 | Percey | 370/518 |
| 6,473,476 B1 * | 10/2002 | Banks | 375/354 |
| 6,501,309 B1 | 12/2002 | Tomita | 327/158 |
| 6,580,776 B1 * | 6/2003 | Chang et al. | 377/47 |
| 6,617,893 B1 * | 9/2003 | Born et al. | 327/115 |

FOREIGN PATENT DOCUMENTS

EP 0655840 A2 11/1994

(Continued)

OTHER PUBLICATIONS

U.S. Appl. No. 10,618,404, filed Jul. 11, 2003, Young.

(Continued)

*Primary Examiner*—Tuan T. Lam
(74) *Attorney, Agent, or Firm*—E. Eric Hoffman; Thomas A. Ward; Justin Liu (57) ABSTRACT

A phase matched clock divider includes a first feed-through flip-flop that receives a first input clock signal, and in response, provides a first output clock signal having the same frequency. The first feed-through flip-flop is enabled and disabled in response to a first reset signal. A plurality of series-connected flip-flops each receives the first input clock signal, and in response, provides a divided output clock signal. Each of the series-connected flip-flops is enabled and disabled in response to a second reset signal. The first and second release signals asynchronously disable the associated flip-flops in response to a third reset signal. The first release signal synchronously enables the first feed-through flip-flop in response to the third reset signal and a release clock signal. The second release signal enables the series-connected flip-flops in response to the third reset signal and a release control signal.

21 Claims, 8 Drawing Sheets

FOREIGN PATENT DOCUMENTS

| | | |
|---|---|---|
| EP | 0704975 A1 | 4/1996 |
| JP | 5-191233 | 7/1993 |
| WO | WO97/40576 | 10/1997 |
| WO | WO99/14759 | 3/1999 |
| WO | WO 99/67882 | 12/1999 |

OTHER PUBLICATIONS

Xilinx, Inc.; "Virtex-II Pro Platform FPGA Handbook"; published Oct. 14, 2002; pp. 180-201, available from Xilinx, Inc., 2100 Logic Drive, San Jose, California 95124.

Xilinx, Inc.; "Virtex-II Pro Platform FPGA Handbook"; published Oct. 14, 2002;; pp. 49-58, available from Xilinx, Inc., 2100 Logic Drive, San Jose, California 95124.

U.S. Appl. No. 10/792,055, filed Mar. 2, 2004, Lu.

U.S. Appl. No. 09/684,529, filed Oct. 6, 2000, Logue et al.

U.S. Appl. No. 09/684,540, filed Oct. 6, 2000, Young et al.

U.S. Appl. No. 10/837,324, filed Apr. 30, 2004, Pang et al.

U.S. Appl. No. 10/837,186, filed Apr. 30, 2004, Morrison et al.

U.S. Appl. No. 10/837,059, filed Apr. 30, 2004, Logue et al.

U.S. Appl. 10/683,944, filed Oct. 1, 2003, Young.

Microelectronics Group, Lucent Technologies, Inc., Preliminary Data Sheet, May 1998, ORCA OR3Cxx (5 V), and OR3Txxx (3,3 V) Series Field-Programmable Gate Arrays, pp. 3, 69-80, available from Microelectronics Group, Lucent Technologies, Inc., 555 Union Boulevard, Room 30L-15P-BA, Allentown, PA 18103.

"Actel ES Family Digital Phase Lock Loop Usage", by Joel Landry, Sep. 17, 1996, pp. 1-5, available from Actel Corp., 955 East Arques Avenue, Sunnyvale, California 94086.

* cited by examiner

PHASE MATCHED CLOCK DIVIDER

FIELD OF THE INVENTION

The present invention relates to a phase matched clock divider (PMCD) for providing divided clock signals in response to an input clock signal.

RELATED ART

Certain application specific integrated circuit (ASIC) designs and programmable logic designs require multiple binary divided clocks. These clocks are typically generated using digital clock modules (DCMs) or configurable logic blocks (CLBs) located on the programmable logic device. However, DCMs typically exhibit a significant jitter and high power consumption. A conventional DCM is described in U.S. Pat. No. 6,289,068 and in the "Virtex-II Pro Platform FPGA Handbook" UG012 (v2.0) Oct. 14, 2002, pages 180–201, available from Xilinx, Inc. of San Jose, Calif. CLBs cannot ensure that low skew output clocks are provided, and cannot precisely delay the input clocks. A conventional CLB is described in U.S. Pat. No. 6,400,180 and in the above-referenced Virtex-II Pro Platform FPGA Handbook, pages 49–58.

It would therefore be desirable to have a programmable logic device that includes a phase matched clock divider (PMCD) that provides a plurality of divided clock output signals in response to an input clock signal. It would further be desirable for such a PMCD to provide low skew clock outputs. It would further be desirable to have a PMCD capable of generating a plurality of output clock signals that are delayed versions of additional input clock signals, such that all output clock signals provided by the PMCD preserve the skew relationship of all the input clock signals. It would also be desirable to have a PMCD adapted for usage with other PMCDs on the same programmable logic device. It would further be desirable to have circuit design techniques for enabling the features listed above.

SUMMARY

Accordingly, the present invention provides a PMCD that operates in response to control signals that allow for phase matching across multiple PMCDs.

In accordance with one embodiment, a PMCD includes a first dual-mode flip-flop operating in feed-through mode that receives a first input clock signal, and in response, provides a first output clock signal that has the same frequency. The first output clock signal is delayed from the first input clock signal by the delay path through the first dual-mode flip-flop.

Each of a plurality of series-connected dual-mode flip-flops operating in toggle mode receives the first input clock signal, and in response, provides a divided output clock signal. For example, these series-connected flip-flops can provide output clock signals having frequencies that are equal to one half, one fourth and one eighth the frequency of the first input clock signal.

The first dual mode flip-flop is enabled and disabled in response to a first reset signal, and the plurality of series-connected dual-mode flip-flops are enabled and disabled in response to a second reset signal. The first and second reset signals are generated by reset logic in response to a third reset signal, a release clock signal and a release control signal.

The first and second reset signals asynchronously disable the associated flip-flops when the third reset signal is activated. The first reset signal synchronously enables the first feed-through flip-flop in response to the release clock signal when the third reset signal is deactivated. The first input clock signal may be provided as the release clock signal. The second reset signal enables the plurality of series-connected flip-flops in response to the release control signal when the third reset signal is deactivated. The release control signal can be, for example, a LOCKED control signal provided by an associated DCM.

The release control signal can also be disabled in response to configuration data values stored by the programmable logic device. If the release control signal is disabled, then the second reset signal enables the plurality of series-connected flip-flops at the same time that the first reset signal enables the first flip-flop.

In accordance with another embodiment, the PMCD also includes a second dual-mode flip-flop operating in feed-through mode that receives a second input clock signal, and in response, provides a second output clock signal that has the same frequency. The second output clock signal is delayed from the second input clock signal by the delay path through the second dual-mode flip-flop. The delay paths through the first flip-flop, the second flip-flop and the plurality of series-connected flip-flops are all matched.

The second dual-mode flip-flop is enabled and disabled in response to a first reset signal, in the same manner as the first dual-mode flip-flop.

The PMCD of the present invention can advantageously be used in various configurations with the DCMs, CLBs, and IOBs located on the same programmable logic device. The PMCD of the present invention can also be used in devices other than programmable logic devices.

The present invention will be more fully understood in view of the following description and drawings.

DETAILED DESCRIPTION

Figure 1A:
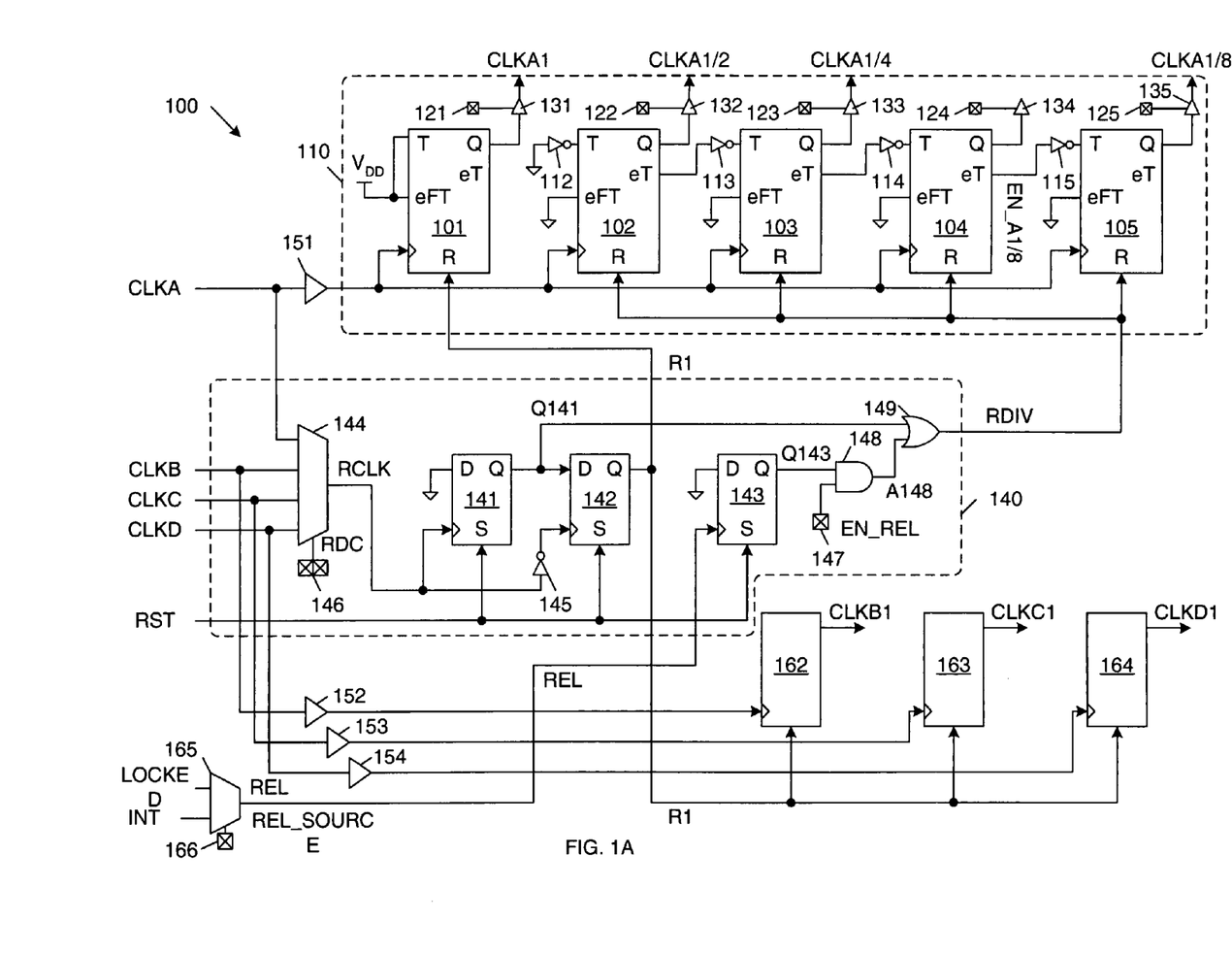
FIG. 1A is a block diagram of a PMCD in accordance with one embodiment of the present invention.

FIG. 1A is a block diagram of a PMCD 100 in accordance with one embodiment of the present invention. PMCD 100 can be fabricated, for example, on a programmable logic device, such as a field programmable gate array (FPGA), or on an application specific integrated circuit (ASIC). An example of an FPGA architecture is described in U.S. patent application Ser. No. 10/618,404, entitled "Columnar Floorplan" by Young, which is incorporated herein by reference. PMCD 100 includes flip-flop chains 110 and 162–164, reset logic 140, input clock buffers 151–154, multiplexer 165 and configuration memory cell 166. In the present embodiment, multiplexer 165 allows the release signal (REL) to be driven by a DCM LOCKED signal or an INT signal from general purpose routing interconnects. In other embodiments multiplexer 165 may have other widths to allow other sources to drive the REL signal.

Flip-flop chain 110 includes dual-mode flip-flops 101–105, inverters 112–115, configuration memory cells 121–125 and output clock buffers 131–135. Output clock buffers 131–135 are enabled/disabled in response to the contents of configuration memory cells 121–125, respectively. Reset logic 140 includes D-Q flip-flops 141–143, multiplexer 144, inverter 145, configuration memory cells 146–147, AND gate 148 and OR gate 149.

An input clock signal CLKA is provided to clock buffer 151. In response, clock buffer 151 provides the buffered CLKA signal to the clock input terminals of dual-mode flip-flops 101–105. Clock buffer 151 ensures that input clock CLKA can effectively drive all the clock terminals of flip-flops 101–105. The reset terminal of flip-flop 101 is coupled to receive the reset signal R1 from reset logic 140, and the reset terminals of flip-flops 102–105 are coupled to receive the reset signal RDIV from reset logic 140.

Additional input clock signals CLKB, CLKC and CLKD are provided to clock buffers 152, 153 and 154, respectively. In response, clock buffers 152, 153 and 154 provide the buffered CLKB, CLKC and CLKD signals to the clock input terminals of flip-flop chains 162, 163 and 164, respectively. Clock buffers 152–154 ensure the CLKB, CLKC and CLKD signals can effectively drive all the clock terminals of flip-flop chains 162–164. Each of flip-flop chains 162–164 is substantially identical to flip-flop chain 110, with differences noted below.

In the described embodiment, each of the dual-mode flip-flops 101–105 has the following operating characteristics. Each of flip-flops 101–105 includes a clock input terminal (designated by a triangle), a reset input terminal (R), an enable feed-through terminal (eFT), a toggle input terminal (T), and data output terminals (Q and eT). When a logic high signal is applied to the eFT terminal, the associated flip-flop operates in a feed-through mode, where the clock signal applied to the clock input terminal is directly provided to the Q output terminal. When a logic low signal is applied to the eFT terminal, the associated flip-flop operates as a toggle flip-flop. In either mode, the clock-to-output (Q) delay is the same. The eT output terminal provides a buffered output signal that is logically the same as the output signal provided on the Q output terminal.

When a logic high signal is applied to the reset input terminal (R), the signal provided by the Q output terminal is asynchronously forced to a logic low state. When a logic high signal is applied to the toggle input terminal (T), the signal on the Q output terminal changes state on the rising edge of the applied clock signal. The signal applied to the toggle input terminal (T) has no effect when the eFT terminal receives a logic high input signal.

Figure 1B:
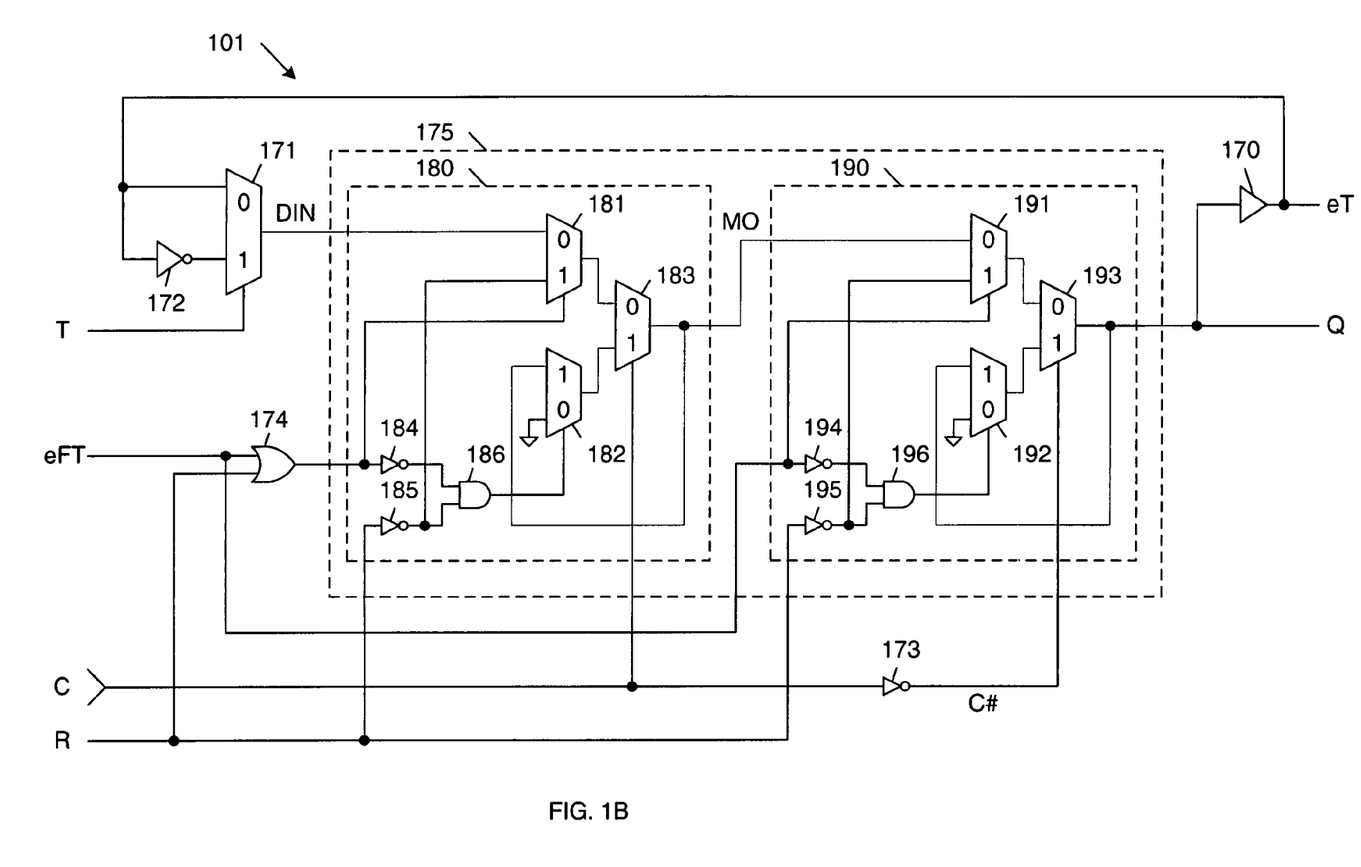
FIG. 1B is a circuit diagram of a dual-mode flip-flop in accordance with one embodiment of the present invention.

FIG. 1B is a circuit diagram of dual-mode flip-flop 101 in accordance with one embodiment of the present invention. In this embodiment, dual-mode flip-flops 101–105 are identical. Dual-mode flip-flop 101 includes output buffer 170, multiplexer 171, inverters 172–173, OR gate 174 and dual-mode D flip-flop 175. Dual-mode D flip-flop 175, in turn, includes master latch 180 and slave latch 190. Master latch 180 includes multiplexers 181–183, inverters 184–185 and AND gate 186. Slave latch 190 includes multiplexers 191–193, inverters 194–195 and AND gate 196. In the described embodiment, the construction of master latch 180 is identical to the construction of slave latch 190.

When the reset signal (R) is activated high, inverters 185 and 195 provide logic "0" output signals, and OR gate 174 provides a logic "1" output signal. The logic "0" signals provided by inverters 185 and 195 cause AND gates 186 and 196 to provide logic "0" output signals. The logic "0" signals provided by AND gates 186 and 96 cause respective multiplexers 182 and 192 to provide logic "0" output signals. The logic "1" signal provided by OR gate 174 causes multiplexer 181 to route the logic "0" signal provided by inverter 185. Thus, both inputs to multiplexer 183 have logic "0" values. As a result, multiplexer 183 provides a logic "0" output signal, regardless of the state of the input clock signal (C).

The logic "0" value provided by multiplexer 183 is applied to an input terminal of multiplexer 191 as a master output signal (MO). The other input terminal of multiplexer 191 receives the logic "0" signal provided by inverter 195. Thus, both inputs to multiplexer 191 have logic "0" values. As a result, multiplexer 191 provides a logic "0" output signal, regardless of the state of the eFT signal. Under these conditions, both inputs to multiplexer 193 receive logic "0" values. As a result, multiplexer 193 provides a logic "0" output signal (Q), regardless of the state of the input clock signal (C). In this manner, flip-flop 101 is asynchronously reset to a logic "0" state when the reset signal (R) is activated high.

When the reset signal (R) is deactivated low, inverters 185 and 195 provide logic "1" output signals. At this time, the mode of flip-flop 101 is selected in response to the signal on the eFT terminal. If this eFT signal has a logic "1" value, flip-flop 101 operates in the feed-through mode. The logic "1" state of the eFT signal causes multiplexer 191 to route the logic "1" signal provided by inverter 195 to multiplexer 193. The logic "1" eFT signal also causes inverter 194 to provide a logic "0" value to AND gate 196, such that this AND gate provides a logic "0" value to multiplexer 192. In response, multiplexer 192 routes a logic "0" value (ground) to multiplexer 193. The input clock signal (C) is inverted by inverter 173, thereby creating inverted clock signal (C#). The inverted clock signal C# is used to control multiplexer 193. Thus, when the inverted clock signal C# has a logic "0" value (i.e., C="1"), multiplexer 193 routes the logic "1" signal provided by multiplexer 191 as the Q output signal. Conversely, when the inverted clock signal C# has a logic "1" value (i.e., C="0"), multiplexer 193 routes the logic "0" signal provided by multiplexer 192 as the Q output signal. Note that the input clock signal C is effectively routed as the Q output signal in a non-inverted manner.

If the eFT signal has a logic "0" value, flip-flop 101 operates as a D flip-flop. When the eFT and R signals have logic "0" states, OR gate 174 provides an output signal having a logic "0" value, thereby causing multiplexer 181 to route the DIN signal provided by multiplexer 171, and causing inverter 184 to provide a logic "1" output signal to AND gate 186. The logic "0" eFT signal also causes multiplexer 191 to route the master output signal MO provided by multiplexer 183. In addition, the logic "0" eFT signal causes inverter 194 to provide a logic "1" signal to AND gate 196. The logic "0" reset signal (R) causes inverters 185 and 195 to provide logic "1" values to AND gates 186 and 196, respectively. As a result, these AND gates 186 and 196 provide logic "1" output signals to multiplexers 182 and 192, respectively. In response, multiplexers 182 and 192 route the output signals MO and Q provided by multiplexers 183 and 193, respectively.

If the toggle signal (T) has a logic "0" value, then the Q output signal provided by multiplexer 193 is routed to multiplexer 181 as the data input signal DIN. Under these conditions, the output signal Q retains the same state in response to the input clock signal (C).

If the toggle signal (T) has a logic "1" value, then the Q output signal is inverted by inverter 172 and applied to multiplexer 181 as the data input signal DIN. On falling edges of the clock signal (C), multiplexer 183 routes this inverted Q signal to multiplexer 191. On rising edges of the clock signal (C), multiplexer 193 routes the inverted Q signal as the Q output signal. Consequently, the Q output signal toggles states on each rising edge of the input clock signal (C).

Note that buffer 170 drives the output signal provided by multiplexer 193 as the eT signal. This buffer 170 isolates any load on the eT output terminal from the Q output terminal. Also note that paths from the inputs of the output multiplexer 193 to the Q signal are designed to be identical, such that the clock-to-output delay of the dual-mode flip-flop 101 is identical regardless of the operating mode.

Returning now to FIG. 1A, because the eFT input terminal of flip-flop 101 is coupled to receive a logic high signal from the $V_{DD}$ supply voltage, flip-flop 101 operates in the feed-through mode. As a result, the buffered CLKA signal applied to the clock input terminal of flip-flop 101 is routed to the Q output terminal if flip-flop 101. If configuration memory cell 121 stores a value that enables buffer 131, then this buffer 131 provides the output clock signal CLKA1 in response to the buffered CLKA signal. When the reset signal R1 is activated high, flip-flop 101 provides a logic "0" output signal CLKA1.

The eFT terminal of flip-flop 102 is coupled to receive a logic low input signal (ground), thereby enabling this flip-flop to operate in the toggle mode. The toggle input terminal of flip-flop 102 is coupled to receive a logic high input signal from inverter 112. Inverter 112 has an input terminal coupled to the ground supply terminal, and an output terminal coupled to the toggle input terminal of flip-flop 102. When the reset signal RDIV is activated (high), flip-flop 102 provides logic low output signals on the Q and eT output terminals. When the reset signal RDIV is deactivated (low), flip-flop 102 toggles the output signals provided on the Q and eT output terminals in response to each rising edge of the buffered CLKA signal. That is, flip-flop 102 provides output signals Q and eT, each having a frequency that is half the frequency of the buffered CLKA signal. If configuration memory cell 122 stores a value that enables buffer 132, then this buffer 132 provides an output clock signal CLKA1/2 having a frequency that is half the frequency of the buffered CLKA signal.

The toggle input terminal of flip-flop 103 is coupled to receive a signal that is equivalent to the inverse of the CLKA1/2 signal through inverter 113. When the reset signal RDIV is activated (high), flip-flop 103 provides a logic low output signal, CLKA1/4. When the reset signal RDIV is deactivated (low), flip-flop 103 operates in response to the CLKA signal and a signal that is equivalent to the CLKA1/2 signal. More specifically, flip-flop 103 toggles the output signal CLKA1/4 each time that the CLKA1/2 signal has a logic "0" state at a rising edge of the CLKA signal. That is, flip-flop 103 provides an output signal CLKA1/4 having a frequency that is half the frequency of the CLKA1/2 signal (i.e., one fourth the frequency of the CLKA signal).

The toggle input terminal of flip-flop 104 is coupled to receive a signal that is equivalent to the inverse of the CLKA1/4 signal through inverter 114. When the reset signal RDIV is activated (high), flip-flop 104 provides a logic low output signal, EN_CLKA1/8. When the reset signal RDIV is deactivated (low), flip-flop 104 operates in response to the CLKA signal and a signal that is equivalent to the CLKA1/4 signal. More specifically, flip-flop 104 toggles the output signal EN_CLKA1/8 each time that the CLKA1/4 signal has a logic "0" state at a rising edge of the CLKA signal.

The toggle input terminal of flip-flop 105 is coupled to receive the EN_CLKA1/8 signal through inverter 115. When the reset signal RDIV is activated (high), flip-flop 105 provides a logic low output signal, CLKA1/8. When the reset signal RDIV is deactivated (low), flip-flop 105 operates in response to the CLKA signal and the EN_CLKA1/8 signal. More specifically, flip-flop 105 toggles the output signal CLKA1/8 each time that the EN_CLKA1/8 signal has a logic "0" state at a rising edge of the CLKA signal. Thus, flip-flop 105 provides an output signal (CLKA1/8) having a frequency that is half the frequency of the CLKA1/4 signal (i.e., one eighth the frequency of the CLKA signal). Note that in some embodiments, additional flip-flops may be added to flip-flop chain 110 to further divide the input clock signal.

As described above, each of flip-flop chains 162–164 is substantially identical to flip-flop chain 110. More specifically, each of flip-flop chains 162–164 has the same structure as flip-flop chain 110, but with a different configuration. Each of flip-flop chains 162–164 includes a dual-mode flip-flop that is configured in the same manner as flip-flop 101 of flip-flop chain 100 (FIG. 1A). These equivalent flip-flops in flip-flop chains 162–164 are coupled to receive the CLKB, CLKC and CLKD signals, respectively, from buffers 152, 153 and 154, respectively, and in response, provide the output clock signals CLKB1, CLKC1 and CLKD1, respectively.

Each of flip-flop chains 162–164 also includes a plurality of dual-mode flip-flops that correspond to flip-flops 102–105 of flip-flop chain 100 (FIG. 1A). However, these corresponding flip-flops in flip-flop chains 162–164 are permanently held in a reset state by applying a logic high signal to the reset terminals (R) of these flip-flops. In addition, the output buffers associated with these flip-flops (i.e., the output buffers corresponding with output buffers 132–135 of flip-flop chain 100) are disabled. The sole purpose of these plurality of flip-flops in flip-flop chains 162–164 is to provide the same loading on the clock inputs driven by buffers 152–154 as the clock input driven by buffer 151. This matching ensures that the delays from all of the PMCD clock inputs (CLKA-CLKD) to all of the clock outputs are identical.

Figure 2:
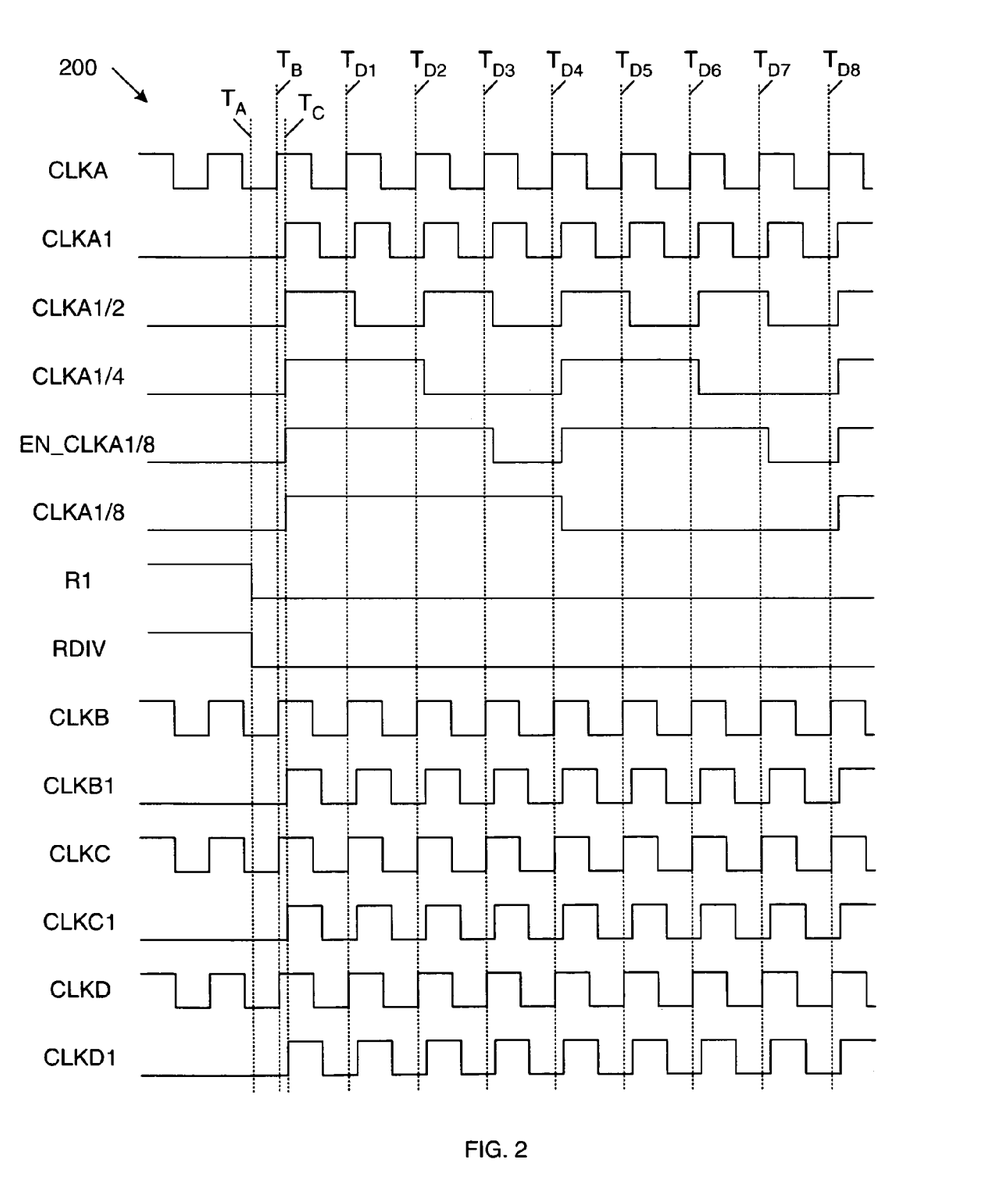
FIG. 2 is a waveform diagram illustrating various signals associated with a flip-flop chain of the PMCD of FIG. 1A, in accordance with one embodiment of the present invention

FIG. 2 is a waveform diagram illustrating various signals associated with flip-flop chains 110 and 162–164, in accordance with one embodiment of the present invention. Before time $T_A$, the reset signals R1 and RDIV are activated high by activating the reset signal (RST) high. Under these conditions, flip-flops 101–105 are reset, such that the CLKA1, CLKA1/2, CLKA1/4, EN_CLKA1/8 and CLKA1/8 signals all have logic "0" values. Also, flip-flop chains 162–164 are reset, such that the CLKB1, CLKC1 and CLKD1 signals all have logic "0" values. At time $T_A$, the reset signals R1 and RDIV are deactivated low, thereby releasing flip-flop chains 110 and 162–164 from their reset states.

The CLKA signal subsequently transitions to a logic high state at time $T_B$. After a short delay, the output signals CLKA1, CLKA1/2, CLKA1/4, EN_CLKA1/8 and CLKA1/8 of flip-flops 101–105, respectively, toggle to a logic high state in response to the rising edge of the CLKA signal and the logic "1" signals applied to the toggle input terminals of flip-flops 102–105. After the same short delay, the output signals CLKB1, CLKC1 and CLKD1 of flip-flops 162, 163 and 164, respectively, toggle to a logic high state in response to the rising edges of the CLKB, CLKC and CLKD signals, respectively. These transitions occur at time $T_C$. Note that flip-flops 101–105 and the corresponding flip-flops in flip-flop chains 162–164 provide matching clock-to-out paths for output signals CLKA1, CLKA1/2, CLKA1/4, EN_CLKA1/8, CLKA1/8, CLKB1, CLKC1 and CLKD1, such that no skew is added between these output signals.

As described above, the CLKA signal is routed through flip-flop 101 to provide the CLKA1 signal. Consequently, the CLKA1 signal has the same frequency as the CLKA signal.

At times $T_{D1}$–$T_{D8}$, the CLKA signal transitions to a logic high state while the CLKA1 signal has a logic "0" state. As described above, this causes the CLKA1/2 signal to change logic states at these times. Thus, rising edges of the CLKA1/2 signal are aligned with rising edges of the CLKA1 signal. Again, the CLKA1/2 signal has a frequency equal to half the frequency of the CLKA1 signal.

At times $T_{D2}$, $T_{D4}$, $T_{D6}$ and $T_{D8}$, the CLKA signal transitions to a logic high state while the CLKA1/2 signal has a logic "0" state. As described above, this causes the CLKA1/4 signal to change logic states at these times. Thus, rising edges of the CLKA1/4 signal are aligned with rising edges of the CLKA1 and CLKA1/2 signals. Again, the CLKA1/4 signal has a frequency equal to half the frequency of the CLKA1/2 signal.

At times $T_{D3}$, $T_{D4}$, $T_{D7}$ and $T_{D8}$, the CLKA signal transitions to a logic high state while the CLKA1/4 signal has a logic "0" state. As described above, this causes the EN_CLKA1/8 signal to change logic states at these times.

At times $T_{D4}$ and $T_{D8}$, the CLKA signal transitions to a logic high state while the EN_CLKA1/8 signal has a logic "0" state. As described above, this causes the CLKA1/8 signal to change logic states at these times. Thus, rising edges of the CLKA1/8 signal are aligned with rising edges of the CLKA1, CLKA/2 and CLKA1/4 signal. Again, the CLKA1/8 signal has a frequency equal to half the frequency of the CLKA1/4 signal.

Returning to FIG. 1A, reset logic 120 will now be described. Input terminals of multiplexer 144 are coupled to receive the input clock signals CLKA, CLKB, CLKC and CLKD. As described in more detail below, each of these four clock signals can be provided by a digital clock module (DCM) located on the same programmable logic device as PMCD 100. Multiplexer 144 routes one of the four input clock signals as the release clock signal RCLK in response to configuration data values (RDC) stored in configuration memory cells 146. In an alternate embodiment, multiplexer 146 can be controlled by user signals. The RCLK signal is applied to the clock terminal of flip-flop 141. The inverse of the RCLK signal is applied to the clock terminal of flip-flop 142 by inverter 145. The set input terminals of flip-flops 141 and 142 are coupled to receive a reset signal RST. The D input terminal of flip-flop 141 is coupled to the ground supply terminal. The Q output terminal of flip-flop 141 is coupled to the D input terminal of flip-flop 142 (and to an input terminal of OR gate 149). The Q output terminal of flip-flop 142 provides the R1 reset signal to flip-flop 101 and the corresponding flip-flops in flip-flop chains 162–164.

The two input terminals of multiplexer 165 are coupled to receive a LOCKED control signal from an associated DCM, and an INT signal form general purpose routing interconnects. The LOCKED control signal is activated only after the associated DCM has properly fixed the relationship between its reference and feed-back clocks. Multiplexer 165 routes the LOCKED control signal or the INT control signal as the release signal REL, in response to a REL_SOURCE control signal. The REL_SOURCE signal may be provided by configuration memory cell 166. The selection of the REL signal is described below in more detail in connection with FIGS. 5–10.

The release signal REL is applied to the clock terminal of flip-flop 143. The set terminal of flip-flop 143 is coupled to receive the reset signal RST. The D input terminal of flip-flop 143 is coupled to the ground supply terminal. The Q output terminal of flip-flop 143 is coupled to an input terminal of AND gate 148. The other input terminal of AND gate 148 is coupled to receive an enable release control signal (EN_REL) from configuration memory cell 147. The output terminal of AND gate 148 is coupled to an input terminal of OR gate 149. OR gate 149 provides the reset signal RDIV to dual-mode flip-flops 102–105.

Reset logic 140 operates as follows in accordance with one embodiment of the present invention.

Figure 3:
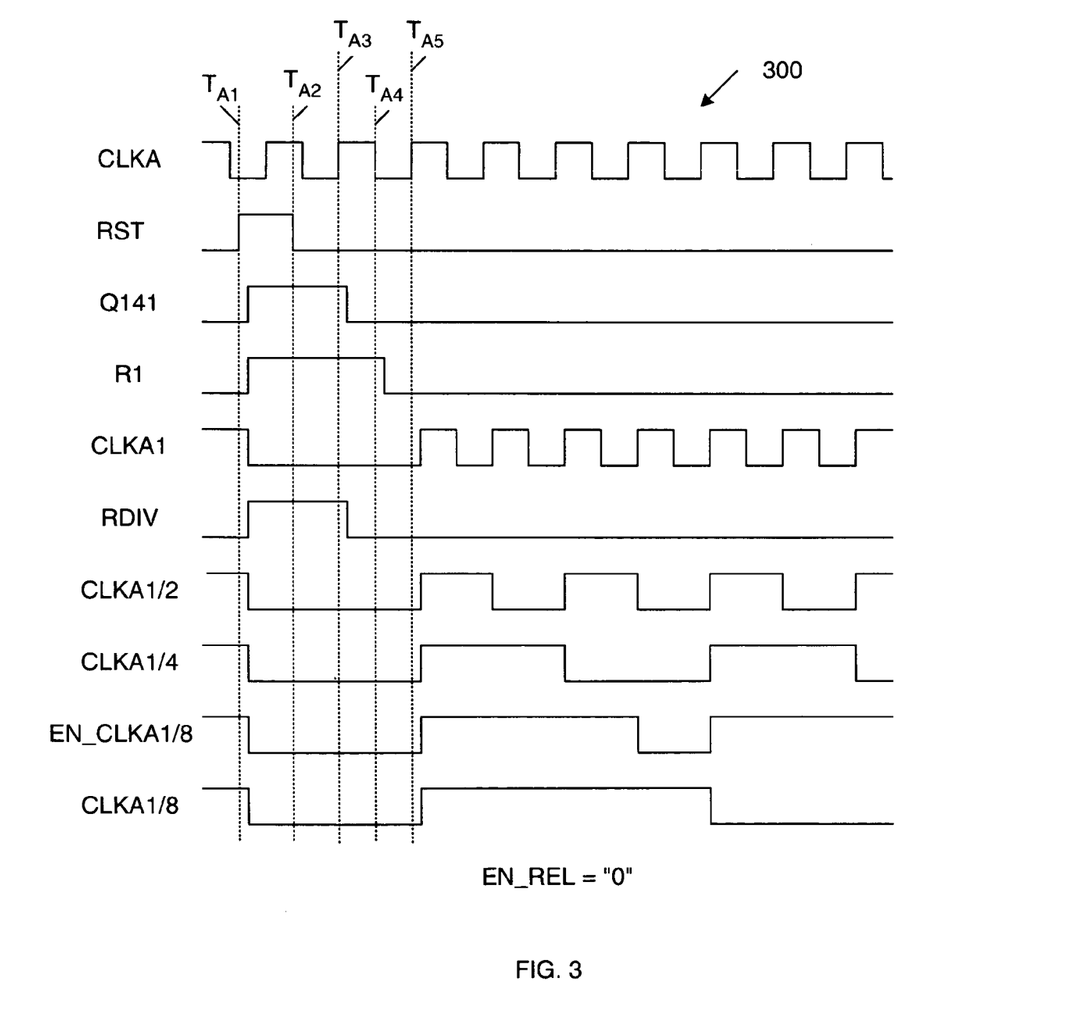
FIG. 3 is a waveform diagram illustrating the operation of reset logic of the PMCD of FIG. 1A in accordance with one embodiment of the present invention.

FIG. 3 is a waveform diagram illustrating the operation of reset logic 140 in accordance with one embodiment of the present invention. In this example, the EN_REL control signal has a logic "0" state. When the reset signal RST is activated (at time $T_{A1}$), each of flip-flops 141–143 is set, and provides a Q output value having a logic "1" state. The logic "1" value (R1) provided by flip-flop 142 causes flip-flop 101 to provide a logic "0" CLKA1 signal. The logic "1" value provided by flip-flop 141 causes OR gate 149 to provide an RDIV signal having a logic "1" value, thereby causing flip-flops 102–105 to provide logic "0" CLKA1/2, CLKA1/4, EN_CLKA1/8 and CLKA1/8 signals. The reset signal RST is therefore capable of asynchronously forcing all of the clock signals CLKA1, CLKA1/2, CLKA1/4 and CLKA1/8 to a logic "0" state.

The reset signal RST is deactivated low (at time $T_{A2}$), thereby allowing all of the output signals CLKA1, CLKA1/2, CLKA1/4, EN_CLKA1/8 and CLKA1/8 to subsequently begin toggling. As described in more detail below, the divided output clocks CLKA1/2, CLKA1/4 and CLKA1/8 may not start toggling immediately (see, FIG. 4).

The de-asserted RST signal is subsequently synchronized in the following manner. Any one of the four input clocks CLKA, CLKB, CLKC or CLKD can synchronize the de-assertion of the RST signal. The RDC signal applied to multiplexer 144 determines which input clock synchronizes the de-assertion of the RST signal.

In the present example, multiplexer 144 is controlled to route the CLKA signal as the release clock signal RCLK. After the reset signal RST is deactivated low, the RCLK signal transitions to a logic "1" state (at time $T_{A3}$). In response, flip-flop 141 provides a logic "0" Q output signal (Q141). The RCLK signal then transitions to a logic "0" state (at time $T_{A4}$). At this time, the logic "0" output signal Q141 is latched into flip-flop 142, thereby providing a reset signal R1 having a logic "0" state. At this time, flip-flop 101 is allowed to operate in response to the CLKA signal. Thus, when the CLKA signal transitions to a logic "1" state (at time $T_{A5}$), the CLKA1 signal similarly transitions to a logic "1" state.

Because the EN_REL value provided by configuration memory cell 147 has a logic "0" value, the release signal REL is disabled (i.e., has no effect on the operation of flip-flop 143 and AND gate 148.). In this case, AND gate 148 provides a logic "0" output signal regardless of the status of flip-flop 143. Thus, the RDIV signal provided by OR gate 149 transitions to a logic "0" state when the Q141 signal provided by flip-flop 141 transitions to a logic "0" state (i.e., at time $T_{A3}$). At this time, flip-flops 102–105 are allowed to operate in response to the CLKA signal. Thus, when the CLKA signal transitions to a logic "1" state (at time $T_{A5}$), the CLKA1/2, CLKA1/4, EN_CLKA1/8, and CLKA1/8 signals similarly transition to logic "1" states. Because their first transitions occurred together, all output clocks are phase matched.

Figure 4:
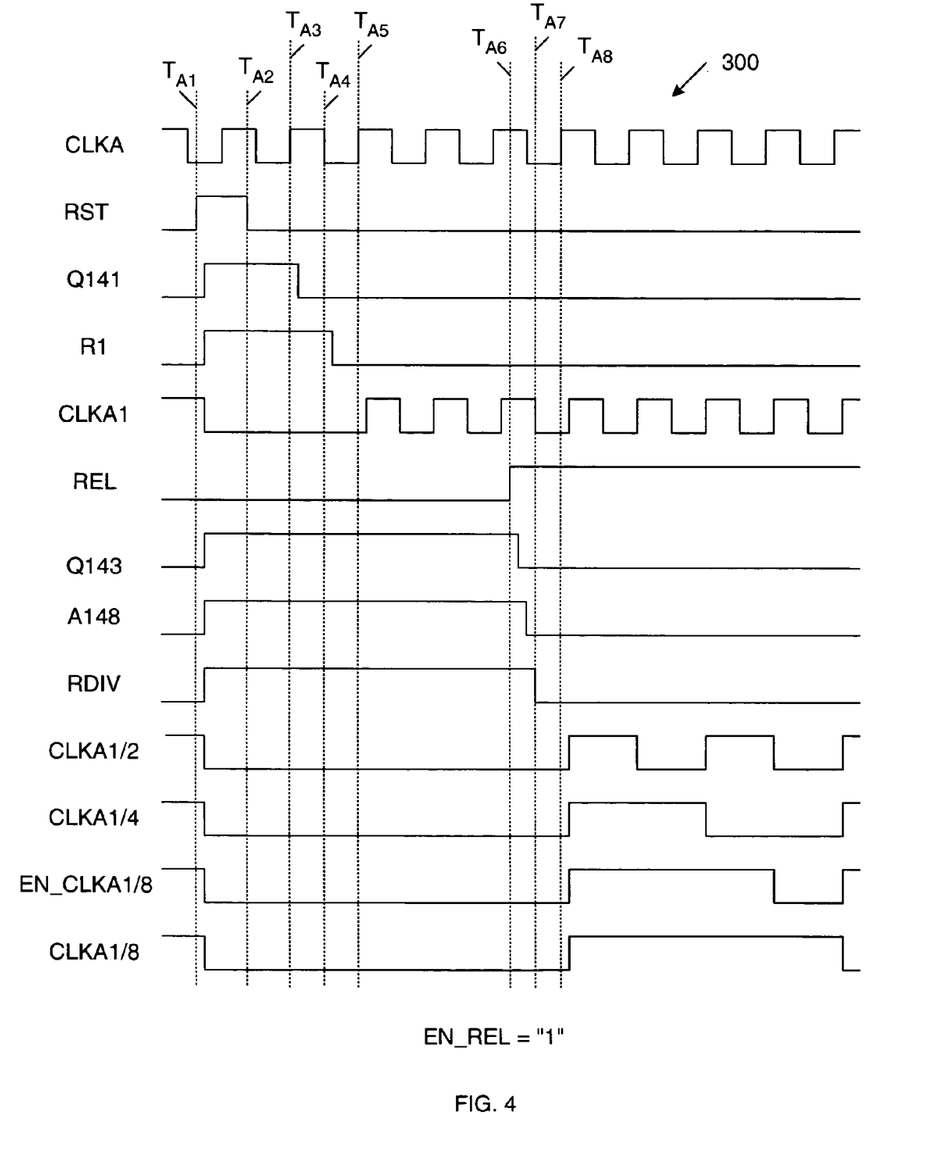
FIG. 4 is a waveform diagram illustrating the operation of reset logic of the PMCD of FIG. 1A in accordance with another embodiment of the present invention.

FIG. 4 is a waveform diagram illustrating the operation of reset logic 140 when the EN_REL value provided by configuration memory cell 147 has a logic "1" value, such that the release signal REL is enabled. The CLKA, RST, Q141, R1 and CLKA1 signals operate in the same manner described above in connection with FIG. 3. However, in this embodiment, the REL signal is not activated to a logic "1" state until time $T_{A6}$. Note that time $T_{A6}$ can occur any number of CLKA cycles after time $T_{A5}$, depending on when the source of the REL signal is activated high. That is, the REL signal is not activated high until the LOCKED signal routed by multiplexer 1655 is activated high (assuming the LOCKED signal is selected by multiplexer 165).

Prior to time $T_{A6}$, the output signal (Q143) provided by flip-flop 143 remains at a logic "1" state. As a result of the logic high Q143 signal and the logic high EN_REL signal, AND gate 148 provides a logic high output signal (A148) prior to time $T_{A6}$. As a result, the RDIV output signal provided by OR gate 149 remains high, even after the Q141 signal transitions to a logic "0" state at time $T_{A3}$. As long as the RDIV signal stays high, flip-flops 102–105 continue to provide logic "0" output signals. That is, the divided clock signals CLKA1/2, CLKA1/4, EN_CLKA1/8 and CLKA1/8 are disabled.

When the REL signal transitions to a logic "1" state at time $T_{A6}$, flip-flop 143 transitions to provide a Q143 output signal having a logic "0" state. The logic "0" state of the Q143 signal causes AND gate 148 to provide a logic "0" output signal (A148). The logic "0" state of the A148 output signal causes OR gate 149 to provide an RDIV signal having a logic "0" state at time $T_{A7}$. At this time, flip-flops 102–105 are allowed to operate in response to the CLKA signal. That is, the divided clock signals CLKA1/2, CLKA1/4, EN_CLKA1/8, and CLKA1/8 are enabled. Thus, when the CLKA signal subsequently transitions to a logic "1" state at time $T_{A8}$, the CLKA1/2, CLKA1/4, EN_CLKA1/8, and CLKA1/8 signals similarly transition to logic "1" states.

As described above, PMCD 100 advantageously creates multiple rising-edge aligned divided clock signals. Because DCMs on the same programmable logic device no longer have to perform this function, these DCMs can advantageously be used for other purposes. Compared to clock division performed by a DCM, the clock division performed by PMCD 100 offers less jitter, more accurate phase alignment and much lower power consumption.

PMCD 100 preserves edge alignment, such that the skew between the output clocks is identical to the skew between the input clocks. That is, the delay from CLKA to CLKA1 is identical to the delay from CLKB to CLKB1, the delay from CLKC to CLKC1, and the delay from CLKD to CLKD1. If all input clocks are phase matched, then all output clocks will also be phase matched. That is, PMCD 100 does not re-align skewed clocks.

As described in more detail below, PMCD 100 can be used with DCMs on the same programmable logic device. In one embodiment, each DCM is only allowed to drive PMCDs that are located on the same half of the programmable logic device as the DCM. This close proximity guarantees timing of the various signals. In this embodiment, dedicated timing-matched routes are provided for specific signal transmitted from each DCM to the PMCDs located on the same half of the programmable logic device. As described in more detail below, these signals may include a CLK0 signal, a CLK2X signal and a LOCKED signal provided by the DCM.

In another embodiment, when two PMCDs are used in parallel, both PMCDs are physically located in the same tile of programmable logic, thereby ensuring that the output clocks provided by the PMCDs are precisely aligned. Routing software is adapted to ensure that this placement rule is followed, and will provide warnings if user constraints violate this placement rule.

Figure 5:
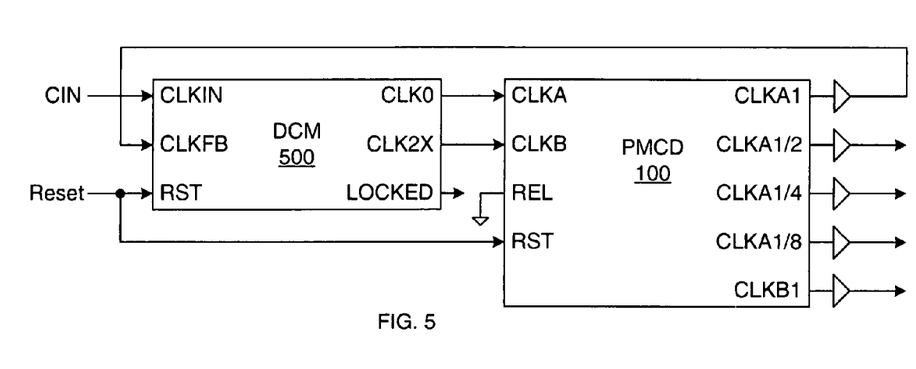
FIG. 5 is a block diagram illustrating a DCM and the PMCD of FIG. 1A in accordance with one embodiment of the present invention.

FIG. 5 is a block diagram illustrating the connection of a DCM 500 and PMCD 100 in accordance with one embodiment of the present invention. In this embodiment, the input clock terminal CLKIN of DCM 500 is coupled to receive an input clock signal (CIN). In response, DCM 500 provides a first output clock signal (CLK0) having the same frequency as the CIN signal, and a second output clock signal (CLK2X) having a frequency that is twice the frequency of the CLKIN signal. The CLK0 signal is applied to PMCD 100 as the input clock signal CLKA, and the CLK2X signal is applied to PMCD 100 as the input clock CLKB. Within PMCD 100, the RDC signal is selected such that multiplexer 144 routes the CLK0 signal as the RCLK signal. Also within PMCD 100, the EN_REL signal is selected to have a logic "0" value. The reset terminals RST of DCM 500 and PMCD 100 controlled by a common reset signal.

Under these conditions, PMCD 100 provides output clock signals CLKA1, CLKA1/2, CLKA1/4 and CLKA1/8 in response to the CLK0 signal in the manner described above in connection with FIG. 3. The CLKA1 signal is provided to the feedback input terminal (CLKFB) of DCM 500. DCM 500 controls the delay introduced to the CIN signal, such that the CIN and CLKFB inputs exhibit a desired phase relationship. For example, DCM 500 may introduce delay to the CIN signal, such that the CLKA1 signal at the CLKFB input is rising edge aligned with the CIN signal. In this example, rising edges of the CLK0 signal are synchronized with rising edges of the CLK2X signal. PMCD 100 routes the CLK2X signal as the CLKB1 signal in the manner described above in connection with FIG. 2. As a result, rising edges of the CLKA1, CLKA1/2, CLKA1/4, CLKA1/8 and CLKB1 signals are synchronized.

In the present embodiment, the feedback loop to DCM 500 must be properly created. That is, the CLKFB signal must be derived from a non-divided clock output signal of DCM 500. That is, the CLKFB signal must ultimately be driven by the CLK0 or CLK2X signal provided by DCM 500. The RCLK signal must also be derived from the CLK0 or CLK2X signal. DCM 500 holds the other DCM output clocks low until the LOCKED signal is activated high (i.e., until the CLKA1 signal is synchronized with the CLKIN signal). These other DCM output clocks can include a CLK90 signal, which lags the CLK0 signal by 90 degrees, a CLK180 signal, which lags the CLK0 signal by 180 degrees, a CLK270 signal, which lags the CLK0 signal by 270 degrees, and a CLKDV signal, which is a frequency divided version of the CLK0 signal.

In a variation of the configuration of FIG. 5, the CLK0 signal is applied to PMCD 100 as the CLKB signal, and the CLK2X signal is applied to PMCD 100 as the CLKA signal.

Figure 6:
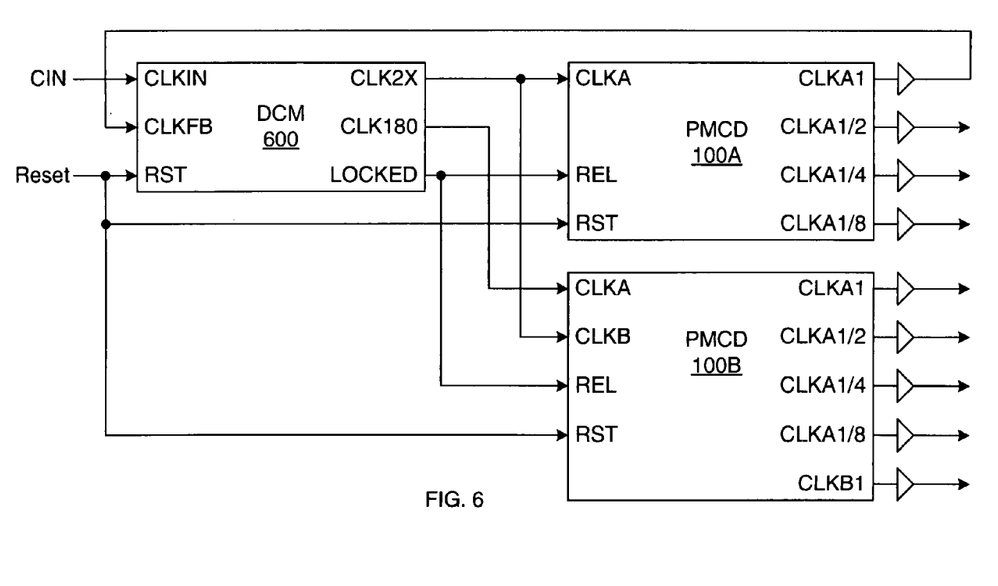
FIG. 6 is a block diagram illustrating a DCM and parallel PMCDs in accordance with another embodiment of the present invention.

FIG. 6 is a block diagram illustrating the connection of a DCM 600 and parallel PMCDs 100A and 100B in accordance with another embodiment of the present invention. PMCDs 100A and 100B are identical to PMCD 100 (FIG. 1A). In this embodiment, DCM 600 receives an input clock signal (CIN), and in response, provides an output clock signal (CLK2X) having a frequency that is twice the frequency of the CIN signal, and an output clock signal (CLK180) having the same frequency as the CIN signal, but which lags the CLK0 signal (if it were used) by 180 degrees. The CLK2X signal is applied to PMCD 100A as the input clock signal CLKA. The CLK2X signal is also applied to PMCD 100B as the input clock signal CLKB. The CLK180 signal is applied to PMCD 100B as the input clock signal CLKA. Within PMCD 100A, the RDC signal is selected such that the CLK2X signal is routed as the RCLK signal. Within PMCD 100B, the RDC signal is selected such that the CLK2X signal is routed as the RCLK signal.

Also within each of PMCDs 100A and 100B, the EN_REL signal is selected to have a logic "1" value. The REL terminals of PMCDs 100A and 100B are coupled to receive the LOCKED signal provided by DCM 600. When using one or more PMCDs with a DCM, the LOCKED signal provided by the DCM should directly drive the REL signal in each of the PMCDs, if the EN_REL signal is active. The reset terminals RST of DCM 600 and PMCDs 100A and 100B are controlled by a common reset signal. The RST signal applied to PMCDs 100A and 100B must be de-asserted before the REL (LOCKED) signal is asserted.

Under these conditions, PMCD 100A provides output clock signals CLKA1, CLKA1/2, CLKA1/4 and CLKA1/8 in response to the CLK2X signal in the manner described above in connection with FIG. 4. Thus, the output clock signal CLKA1 is a slightly delayed version of the CLK2X signal. The CLKA1 signal is provided to the feedback input terminal (CLKFB) of DCM 600. DCM 600 controls the delay introduced to the CIN signal, such that the CIN signal at the CLKIN input and the CLKA1 signal at the CLKFB input exhibit a desired phase relationship. For example, DCM 600 may introduce delay to the CIN signal, such that rising edges of the CIN signal are synchronized with rising edges CLKA1 signal. When this synchronization is achieved, DCM 600 activates the LOCKED signal, thereby enabling PMCDs 100A and 100B to provide the divided clock signals.

PMCD 100B also provides output clock signals CLKA1, CLKA1/2, CLKA1/4 and CLKA1/8 in the manner described above in connection with FIG. 4. Thus, the output clock signal CLKA1 provided by PMCD 100B is a delayed version of the CLK180 signal. Similarly, the output clock signal CLKB1 provided by PMCD 100B is a slightly delayed version of the CLK2X signal. PMCD 100B is enabled to generate the CLKA1/2, CLKA1/4 and CLKA1/8 output signals in response to the CLK180 signal after the LOCKED signal is activated. In the foregoing manner, PMCDs 100A and 100B are able to provide nine different output clock signals having synchronized rising edges in response to the CIN signal.

In this embodiment, the feedback loop to DCM 600 must be properly created. That is, the CLKFB signal must be derived from a non-divided clock output signal. That is, the CLKFB signal must ultimately be driven by the CLK0 or CLK2X signal. In addition, the RCLK signal in each of PMCDs 100A and 100B must be derived from either the CLK0 or CLK2X signal. DCM 600 holds the other DCM output clocks (e.g., CLK0, CLK90, CLK270 and CLKDV) low until the LOCKED signal is activated high. This behavior maintains the phase matching of multiple, parallel PMCDs driven by DCM 600, wherein the LOCKED output of DCM 600 drives the REL inputs of the parallel PMCDs (e.g., PMCDs 100A and 100B). The LOCKED output is only synchronized to CLK0 and CLK2X signals. If a DCM output clock that is not synchronized with the LOCKED output is active before the LOCKED output, then there is no guarantee that the outputs of multiple, parallel PMCDs (e.g., 100A and 100B) will be phase matched. In addition, the REL terminals of PMCDs 100A and 100B must be driven directly by the LOCKED output terminal of DCM 600 using the dedicated internal routes, in order to guarantee the timing between the LOCKED signal and clocks CLK0 and CLK2X.

Figure 7:
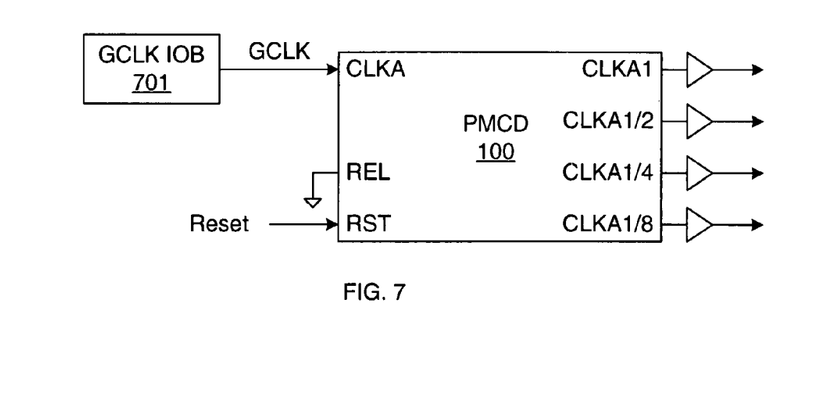
FIG. 7 is a block diagram illustrating a global clock input/output buffer and the PMCD of FIG. 1A in accordance with one embodiment of the present invention.

FIG. 7 is a block diagram illustrating the connection of a global clock input/output buffer (IOB) 701 and PMCD 100 in accordance with another embodiment of the present invention. In this embodiment, global clock IOB 701 provides an input clock signal (GCLK) to PMCD 100 as the CLKA input signal. Within PMCD 100, the RDC signal is selected such that multiplexer 144 routes the GCLK signal as the RCLK signal. Also within PMCD 100, the EN_REL signal is selected to have a logic "0" value. Under these conditions, PMCD 100 provides output clock signals CLKA1, CLKA1/2, CLKA1/4 and CLKA1/8 in the manner described above in connection with FIG. 3.

Figure 8:
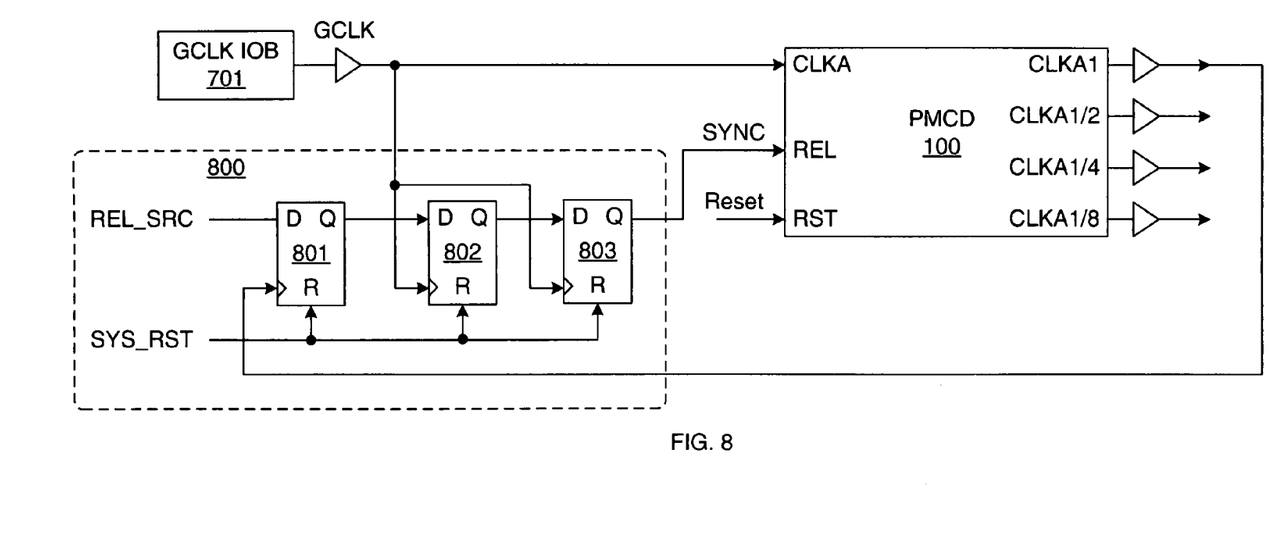
FIG. 8 is a block diagram illustrating a global clock input/output buffer, a global clock net buffer, the PMCD of FIG. 1A, and synchronization logic in accordance with another embodiment of the present invention.

FIG. 8 is a block diagram illustrating the connection of global clock input/output buffer (IOB) 701 and PMCD 100 using synchronization logic 800 in accordance with another embodiment of the present invention. Synchronization logic 800 may be created by, for example, configuring one or more configurable logic blocks (CLBs) of a programmable logic device. In general, synchronization logic 800 synchronizes the source of the REL signal (REL_SRC) from the PMCD output clock domain to the PMCD input clock domain.

Global clock IOB 701 provides the GCLK signal to PMCD 100 (as the CLKA input signal) and synchronization logic 800. Within PMCD 100, the RDC signal is selected such that multiplexer 144 routes the GCLK signal as the RCLK signal. Also within PMCD 100, the EN_REL signal is selected to have a logic "1" value. PMCD 100 provides the CLKA1 signal in response to the GCLK signal in the manner described above in connection with FIGS. 3 and 4. As described above, the CLKA1 signal is a delayed version of the GCLK signal. The CLKA1 signal is applied to synchronization logic 800.

After synchronization logic 800 translates the REL_SRC signal from the CLKA1 domain to the GCLK domain, synchronization logic 800 activates a SYNC signal (which is coupled to the REL input terminal of PMCD 100) to a logic high state. In response, PMCD 100 enables the divided clock signals CLKA1/2, CLKA1/4 and CLKA1/8 to be generated in response to the GCLK signal in the manner described above in connection with FIG. 4.

In one embodiment, synchronization logic 800 includes D-Q flip-flops 801–803, which are connected as illustrated. Flip-flops 801–803 are initially reset in response to a system reset signal (SYS_RST). Flip-flop 801 registers the REL_SRC signal in response to the CLKA1 signal (i.e., the CLKA1 domain). The REL_SRC signal is generated from the user's design. Flip-flops 802 and 803 transfer the output signal provided by flip-flop 801 in response to the GCLK signal, such that flip-flop 803 provides the SYNC signal in the GCLK domain. As a result, flip-flops 802–803 transfer the REL_SRC signal from the CLKA1 domain to the GCLK domain to create the SYNC signal.

Figure 9:
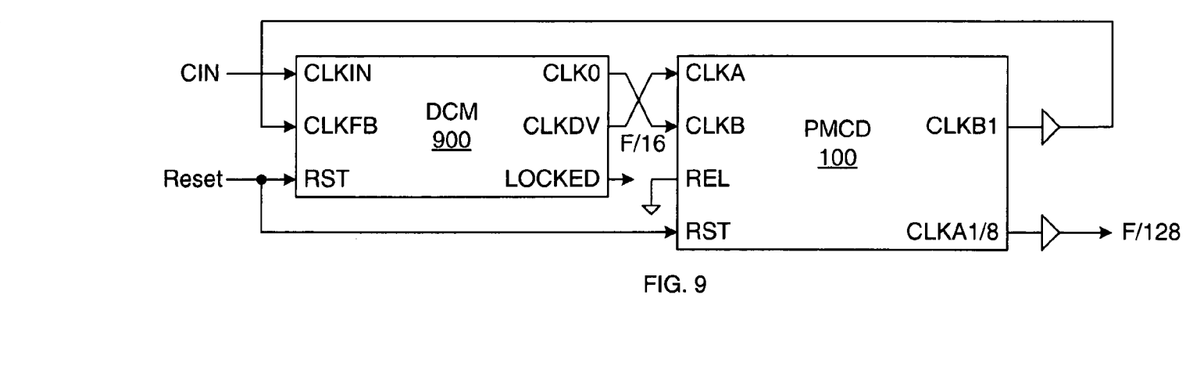
FIG. 9 is a block diagram illustrating a DCM and the PMCD of FIG. 1A, which provide a high clock division function in accordance with another embodiment of the present invention.

FIG. 9 is a block diagram illustrating DCM 900 and PMCD 100, which are configured to provide a high clock division function in accordance with another embodiment of the present invention. In this embodiment, DCM 900 receives an input clock signal (CIN), and in response, provides an output clock signal (CLK0) having the same frequency as the CIN signal, and an output clock signal (CLKDV) having a frequency that is less than the frequency of the CIN signal by a divisor selected within DCM 900. In the described embodiment, the frequency of the CLKDV signal is 1/16 of the frequency of the CLKIN signal. However, other frequencies can be selected in other embodiments. The CLK0 signal is applied to PMCD 100 as the input clock signal CLKB, and the CLKDV signal is applied to PMCD 100 as the input clock CLKA. Within PMCD 100, the RDC signal is selected such that multiplexer 144 routes the CLK0 signal as the RCLK signal. Also within PMCD 100, the EN_REL signal is selected to have a logic "0" value. The reset terminals RST of DCM 900 and PMCD 100 are controlled by a common reset signal.

Under these conditions, PMCD 100 initially provides an output clock signal CLKB1, which is a slightly delayed version of the CLK0 signal. The CLKB1 signal is provided to the feedback input terminal CLKFB of DCM 900. DCM 900 controls the delay introduced to the CLKIN signal, such that the CIN and CLKB1 signals exhibit a desired phase relationship (e.g., are synchronized).

PMCD 100 also generates an output clock signal CLKA1/8 in response to the CLKDV signal in the manner described above in connection with FIG. 3. As a result, the CLKA1/8 signal provided by PMCD 100 has a frequency that is equal to 1/8 the frequency of the CLKDV signal, or 1/128 the frequency of the CIN signal.

In this embodiment, the feedback loop to DCM 900 must be properly created. That is, the CLKFB signal must be derived from a non-divided clock output signal. That is, the CLKFB signal must ultimately be driven by the CLK0 or CLK2X signal. In addition, the RCLK signal in each of PMCDs 100A and 100B must be derived from either the CLK0 or CLK2X signal. In some embodiments DCM 900 holds the other DCM output clocks (e.g., CLK0, CLK90, CLK270 and CLKDV) low until the LOCKED signal is activated high.

Figure 10:
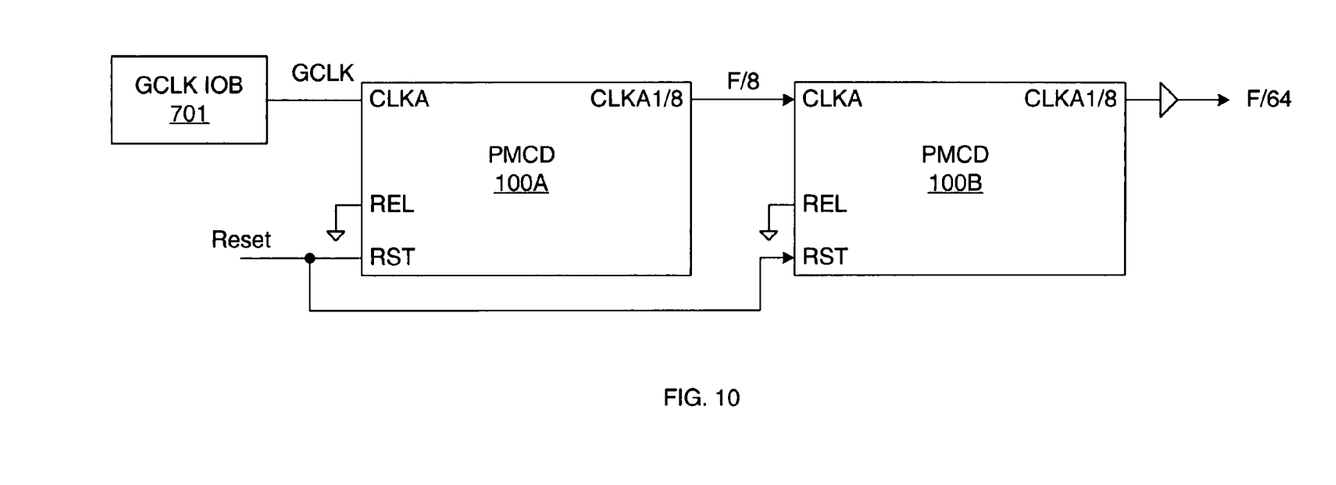
FIG. 10 is a block diagram illustrating a global clock input/output buffer and a pair of PMCDs, which provide a high clock division function in accordance with another embodiment of the present invention.

FIG. 10 is a block diagram illustrating global clock IOB 701 and PMCDs 100A and 100B, which are configured to provide a high clock division function in accordance with another embodiment of the present invention. In this embodiment, PMCD 100A receives the global clock input signal (GCLK) as the CLKA input signal. Within PMCD 100A the RDC signal is selected such that multiplexer 144 routes the GCLK signal as the RCLK signal. Also within PMCD 100A, the EN_REL signal is selected to have a logic "0" value. In response, PMCD 100A provides a CLKA1/8 output clock signal in response to the GCLK signal in the manner described above in connection with FIG. 3. Thus, the CLKA1/8 signal has a frequency that is 1/8 the frequency of the GCLK signal.

The CLKA1/8 signal provided by PMCD 100A is applied to PMCD 100B as the input clock signal CLKA. Within PMCD 100B the RDC signal is selected such that multiplexer 144 routes the CLKA1/8 signal received from PMCD 100A as the RCLK signal. Also within PMCD 100B, the EN_REL signal is selected to have a logic "0" value. In response, PMCD 100B provides a CLKA1/8 output clock signal having a frequency that is 1/64 the frequency of the GCLK signal in the manner described above in connection with FIG. 3. Thus, two or more PMCDs can be connected in series to provide a highly divided output clock signal.

Although the invention has been described in connection with several embodiments, it is understood that this invention is not limited to the embodiments disclosed, but is capable of various modifications, which would be apparent to one of ordinary skill in the art. For example, although the present invention has been described with three divided clock signals, it us understood that the number of divided clock signals provided can easily scale up or down. Thus, the present invention is only intended to be limited by the following claims.

We claim:

1. A phase matched clock divider (PMCD) comprising:
   a first feed-through flip-flop having a clock input terminal coupled to receive a first input clock signal, an output terminal adapted to provide a first output clock signal, and a reset terminal;
   a plurality of series-connected flip-flops, each having a clock input terminal coupled to receive the first input clock signal, an output terminal adapted to provide a divided output clock signal, and a reset terminal; and
   reset logic adapted to provide a first reset signal to the reset terminal of the first feed-through flip-flop, and adapted to provide a second reset signal to the reset terminals of the plurality of series-connected flip-flops;
   wherein the first feed-through flip-flop includes an enable feed-through terminal, the enable feed-through terminal when receiving a feed-through mode signal enables the first input clock signal to be directly provided to the output terminal.

2. The PMCD of claim 1, wherein the reset logic is coupled to receive a third reset signal, the reset logic comprising:
   a first circuit adapted to activate the first reset signal in response to the third reset signal, thereby disabling the first output clock signal; and
   a second circuit adapted to activate the second reset signal in response to the third reset signal, thereby disabling each divided output clock signal.

3. The PMCD of claim 2, wherein the first circuit further synchronously deactivating the first reset signal with a reference clock signal.

4. The PMCD of claim 3, wherein the second circuit further synchronously deactivating the second reset signal with the reference clock signal.

5. A phase matched clock divider (PMCD) comprising:
   a first feed-through flip-flop having a clock input terminal coupled to receive a first input clock signal, an output terminal adapted to provide a first output clock signal, and a reset terminal;

a plurality of series-connected flip-flops, each having a clock input terminal coupled to receive the first input clock signal, an output terminal adapted to provide a divided output clock signal, and a reset terminal; and reset logic adapted to provide a first reset signal to the reset terminal of the first feed-through flip-flop, and adapted to provide a second reset signal to the reset terminals of the plurality of series-connected flip-flops, wherein the reset logic is coupled to receive a third reset signal, the reset logic comprising:

a first circuit adapted to activate the first reset signal in response to the third reset signal, thereby disabling the first output clock signal; and a second circuit adapted to activate the second reset signal in response to the third reset signal, thereby disabling each divided output clock signal;

wherein the first circuit comprises a first flip-flop having a set terminal coupled to receive the third reset signal, and an output terminal coupled to provide the first reset signal to the reset terminal of the first feed-through flip-flop.

6. The PMCD of claim 5, wherein the second circuit comprises a second flip-flop having a set terminal coupled to receive the third reset signal, and an output terminal coupled to the reset terminal of each of the plurality of series-connected flip-flops.

7. The PMCD of claim 6, wherein the output terminal of the second flip-flop is coupled to an input terminal of the first flip-flop, and an input terminal of the second flip-flop is coupled to a voltage supply terminal.

8. The PMCD of claim 7, further comprising a release clock signal coupled to clock input terminals of the first and second flip-flops.

9. The PMCD of claim 8, wherein the reset logic further comprises means for routing the first input clock signal as the release clock signal.

10. The PMCD of claim 6 wherein the second circuit of the reset logic further comprises:

a first logic gate having a first input terminal coupled to the output terminal of the second flip-flop, and an output terminal adapted to provide the second reset signal;

a second logic gate having an output terminal coupled to a second input terminal of the first logic gate;

a third flip-flop having a set terminal coupled to receive the third reset signal, and an output terminal coupled to a first input terminal of the second logic gate; and a configuration memory cell coupled to a second input terminal of the second logic gate.

11. The PMCD of claim 1, wherein the plurality of series-connected flip-flops comprise:

a first dividing flip-flop adapted to provide a first divided clock output signal having a frequency equal to half the frequency of the first input clock signal when the second reset signal is deactivated; and a second dividing flip-flop coupled to the first dividing flip-flop and adapted to provide a second divided clock output signal having a frequency that is equal to one fourth the frequency of the first input clock signal when the second reset signal is deactivated.

12. The PMCD of claim 11, wherein the plurality of series-connected flip-flops further comprise a third dividing flip-flop coupled to the second dividing flip-flop and adapted to provide a third divided clock output signal having a frequency that is equal to one eighth the frequency of the first input clock signal when the second reset signal is deactivated.

13. The PMCD of claim 1, further comprising a second feed-through flip-flop having a clock input terminal coupled to receive a second input clock signal, an output terminal adapted to provide a second output clock signal, and a reset terminal.

14. The PMCD of claim 13, wherein the first feed-through flip-flop and the second feed-through flip-flop have identical delay paths.

15. The PMCD of claim 14, wherein each of the plurality of series-connected flip-flops has a delay path identical to the delay paths of the first and second feed-through flip-flops.

16. The PMCD of claim 2, wherein the second circuit includes means for deactivating the second reset signal when the third reset signal is deactivated and a release control signal is activated.

17. The PMCD of claim 1, wherein the first feed-through flip-flop comprises a dual-mode flip-flop configured in a feed-through mode and each of the plurality of series-connected flip-flops comprises a dual-mode flip-flop configured in a toggle mode.

18. A method of implementing a phase matched clock divider comprising:

providing a first input clock signal to a clock input terminal of a first feed-through flip-flop;

providing the first input clock signal to clock input terminals of a plurality of series-connected flip-flops;

providing a first reset signal to a reset terminal of the first feed-through flip-flop;

providing a second reset signal to reset terminals of each of the plurality of series-connected flip-flops;

activating the first and second reset signals, thereby asynchronously disabling output terminals of the first feed-through flip-flop and output terminals of the plurality of series-connected flip-flops, wherein the first and second reset signals are activated in response to a third reset signal;

deactivating the first reset signal in response to the third reset signal and a release clock signal, thereby enabling the first feed-through flip-flop to route the first input clock signal as a first output clock signal; and routing the first input clock signal as the release clock signal.

19. The method of claim 18, further comprising deactivating the second reset signal in response to the third reset signal and a release control signal, thereby enabling each of the plurality of series-connected flip-flops to provide a divided clock signal in response to the first input clock signal.

20. The method of claim 19, wherein the release control signal is provided by a digital clock manager.

21. The method of claim 18, further comprising:

providing a second input clock signal to a clock input terminal of a second feed-through flip-flop; and providing the first reset signal to a reset terminal of the second feed-through flip-flop.

* * * * *